United States Patent
Wagner et al.

(10) Patent No.: US 7,274,430 B2
(45) Date of Patent: Sep. 25, 2007

(54) OPTICAL ARRANGEMENT AND PROJECTION EXPOSURE SYSTEM FOR MICROLITHOGRAPHY WITH PASSIVE THERMAL COMPENSATION

(75) Inventors: Christian Wagner, Aalen (DE); Michael Trunz, Ellwangen (DE); Ralf Hilgers, Hamburg (DE)

(73) Assignee: Carl Zeiss SMT AG, Oberkochen (DE)

( * ) Notice: Subject to any disclaimer, the term of this patent is extended or adjusted under 35 U.S.C. 154(b) by 349 days.

(21) Appl. No.: 09/934,817

(22) Filed: Aug. 21, 2001

(65) Prior Publication Data

US 2002/0008858 A1    Jan. 24, 2002

Related U.S. Application Data

(63) Continuation-in-part of application No. 09/255,137, filed on Feb. 19, 1999, now abandoned.

(30) Foreign Application Priority Data

Feb. 20, 1998  (DE) .................................. 198 07 094

(51) Int. Cl.
*G03B 27/30*    (2006.01)
(52) U.S. Cl. ........................................................ 355/30
(58) Field of Classification Search ................ 355/30, 355/53, 55, 20, 51, 28; 430/30; 165/80.2; 250/352, 370.15, 548; 356/401; 385/72, 385/73, 75; 359/819, 820, 803; 353/101, 353/102, 122; 399/131, 206
See application file for complete search history.

(56) References Cited

U.S. PATENT DOCUMENTS

| | | | |
|---|---|---|---|
| 3,587,063 A * | 6/1971 | Lamberts .................... 340/173 |
| 3,626,176 A * | 12/1971 | Tsugami ........................ 240/47 |
| 4,155,631 A | 5/1979 | Borsare et al. |
| 4,459,016 A * | 7/1984 | Tokuhara et al. ............. 355/57 |
| 4,577,305 A * | 3/1986 | Allen et al. .................... 369/86 |
| 4,595,273 A * | 6/1986 | Watanabe et al. ........... 355/3 R |
| 4,668,077 A * | 5/1987 | Tanaka ......................... 355/30 |
| 4,739,396 A * | 4/1988 | Hyatt ............................ 358/60 |
| 4,846,578 A * | 7/1989 | Morita et al. ................ 356/446 |
| 4,855,792 A * | 8/1989 | Holbrook et al. ............. 355/53 |
| 5,313,333 A * | 5/1994 | O'Brien et al. ............. 352/820 |
| 5,557,413 A * | 9/1996 | Ebihara et al. ............. 358/296 |
| 5,557,474 A * | 9/1996 | McCrary .................... 359/820 |
| 5,738,165 A | 4/1998 | Imai |
| 5,741,056 A * | 4/1998 | Liu .............................. 353/56 |
| 5,764,312 A * | 6/1998 | Okumura et al. ........... 348/785 |

(Continued)

FOREIGN PATENT DOCUMENTS

EP    0678768    10/1995

(Continued)

*Primary Examiner*—Etienne P. LeRoux
(74) *Attorney, Agent, or Firm*—Fish & Richardson P.C.

(57) ABSTRACT

An optical arrangement with a light source includes an optical element that is fastened in a mount. The light source emits radiation and the optical element is acted on thereby such that the heat that results lacks symmetry corresponding to the shape of the optical element. A connecting structure is provided between the optical element and the mount and has a symmetry that does not correspond to the shape of the optical element and effects an at least partial homogenization of the temperature distribution in the optical element.

22 Claims, 5 Drawing Sheets

U.S. PATENT DOCUMENTS

| | | | |
|---|---|---|---|
| 5,805,273 A * | 9/1998 | Unno | 355/30 |
| 5,883,704 A * | 3/1999 | Nishi et al. | 355/67 |
| 5,953,106 A | 9/1999 | Unno et al. | |
| 6,038,013 A * | 3/2000 | Ohsaki | 355/53 |
| 6,211,896 B1 * | 4/2001 | Morton | 347/225 |
| 2003/0142752 A1 | 7/2003 | Kageyama | |

FOREIGN PATENT DOCUMENTS

| | | |
|---|---|---|
| EP | 0853357 | 7/1998 |
| EP | 0938009 | 8/1999 |
| EP | 1596235 | 11/2005 |
| JP | 59150488 | 8/1984 |
| JP | 59175178 | 10/1984 |
| JP | 61208002 | 8/1986 |
| JP | 06003510 | 1/1994 |

* cited by examiner

US 7,274,430 B2

OPTICAL ARRANGEMENT AND PROJECTION EXPOSURE SYSTEM FOR MICROLITHOGRAPHY WITH PASSIVE THERMAL COMPENSATION

CROSS-REFERENCE TO RELATED APPLICATIONS

This application is a Continuation in Part of patent application Ser. No. 09/255,137 filed Feb. 19, 1999, now abandoned of the same inventors, the priority of which is claimed for this application.

STATEMENT REGARDING FEDERALLY SPONSORED RESEARCH OR DEVELOPMENT

Not applicable.

BACKGROUND OF THE INVENTION

1. Field of the Invention

This invention relates to an optical arrangement with a light source and an optical element, and more particularly to projection exposure systems for microlithography, in which a thermal effect that is not rotationally symmetrical that results from the irradiation from the light source is compensated. Microlithography notoriously is the art of producing structures in the micrometer and submicrometer range—inter alia for microelectronic devices—by photolithography.

This situation is of particular importance in wafer scanners with a slit-shaped image field: either a narrow rectangle slit with a width to length ratio of e.g. typically 1:5 to 1:9, or an arcuate shape, particularly in mirror systems.

2. Discussion of Relevant Art

Active compensation of the imaging errors resulting from asymmetric thermal effects is known from European Patent EP-A 0 678 768, and its corresponding application U.S. Pat. No. 5,803,273 to Unno by regulated or controlled non-rotationally-symmetrical heating or cooling and also, by way of a suggestion, by mechanical stressing.

The like was described earlier in European Patent EP-B1 0 532 236, preferably as heating for mirrors.

SUMMARY OF THE INVENTION

The invention has as its object to markedly reduce or render symmetrical, by the simplest possible means, the change of the properties of optical elements due to light absorption and the resulting heating, particularly in projection exposure systems.

This object is achieved by an optical arrangement and by projection exposure systems having an optical arrangement with the following features:

An optical arrangement with a light source, that emits radiation, having a mount, and an optical element fastened in the mount. The optical element, is acted on by the radiation such that heat results from the radiation that lacks symmetry corresponding to the shape of the optical element. A connecting structure between the optical element and the mount has a symmetry that does not correspond to the shape of the optical element and effects an at least partial homogenization of temperature distribution in the optical element.

Active, controlled or regulated operations on the optical elements are dispensed with. The total energy input into the arrangement is reduced by the avoidance of active elements and particularly of a heating system.

On the other hand, the invention with asymmetrical cooling departs from the proven constructional principles of mountings with high symmetry, which principles particularly for projection exposure systems have heretofore been driven to the utmost.

BRIEF DESCRIPTION OF THE DRAWINGS

The invention will be described in more detail hereinbelow with reference to the accompanying drawings, in which

FIG. 3b shows a section along section line IIIb—IIIb of FIG. 3a;

FIG. 3c shows a section along section line IIIc—IIIc FIG. 3a;

DETAILED DESCRIPTION OF PREFERRED EMBODIMENTS

Figure 1:
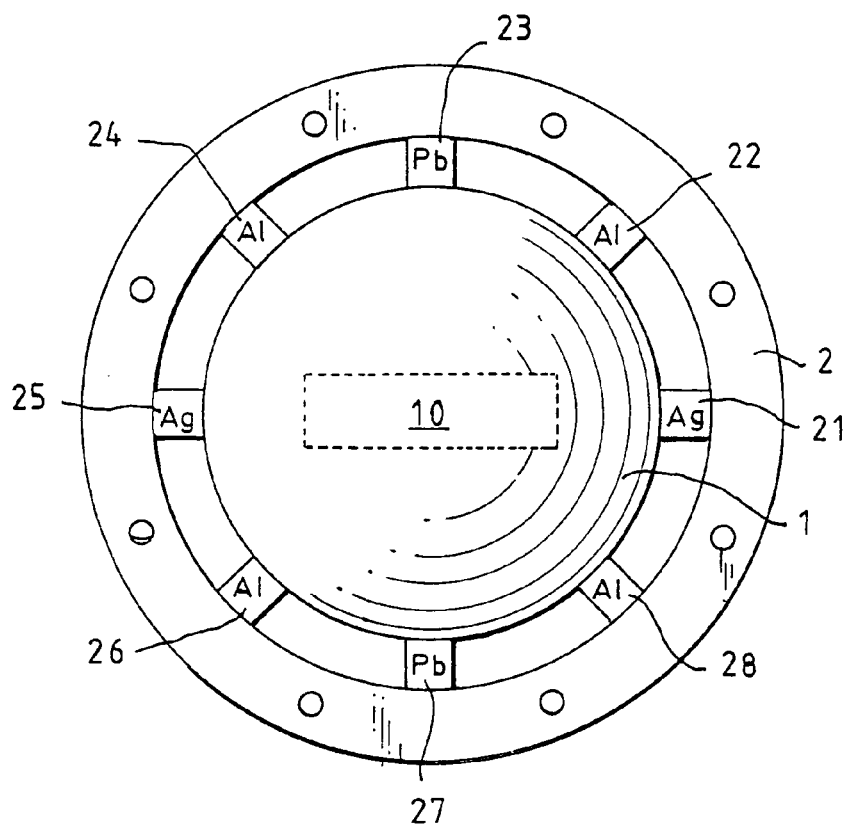
FIG. 1 shows schematically a lens with a slit-shaped illumination and tab connections of different materials.

The arrangement of FIG. 1 shows a lens mount 2 in which a lens 1 is held as free as possible from stress and fixed exactly in position, by numerous webs 21–28 (eight are shown). The webs 21–28 (spokes, tabs) are adhered to the edge of the lens, or connected by other jointing methods.

The lens 1 is illuminated in a slit-shaped cross section 10. The problem in just those projection exposure systems that operate in the VUV (vacuum ultraviolet) and DUV (deep ultraviolet) region is that the lens materials have a considerable absorption, and consequently there is a considerable supply of heat into the cross section 10. The related rise in temperature brings about a change of the refractive index, and in addition a deformation due to thermal expansion. The overall result is a change of the lens operation, with astigmatic operation.

Cooling takes place to only a small extent by means of the surrounding gas (usually helium in projection exposure systems) and by thermal radiation. The heat is transferred to the mount 2 primarily via the lens body 1, the joint spot (adhesive), and the gas in the surroundings of the joint spot, and the webs 21–28.

According to the invention, the webs 21–28 in this embodiment are constituted of different materials, so that they have different thermal conductivities. For example, the webs 21, 25 next to the slit-shaped cross section 10 are of silver, with very good thermal conductivity; those furthest away 23, 27 are of lead, with a low thermal conductivity, and the webs in between 22, 24, 26, 28 are of aluminum with medium thermal conductivity. The temperature distribution in the lens 1 is thus relatively lowered between the webs 21, 23, and relatively raised between the webs 23, 25, whereby there result a homogenization and symmetrization of the temperature distribution and a reduced disturbance of the optical properties of the lens 1.

In practice, further properties of the materials used, such as their strength, elasticity, and thermal expansion are to be considered. Simulation calculations for the mechanical, thermal and optical properties, using the Finite Element Method, make possible an optimized selection and embodiment of the arrangement.

Figure 2:
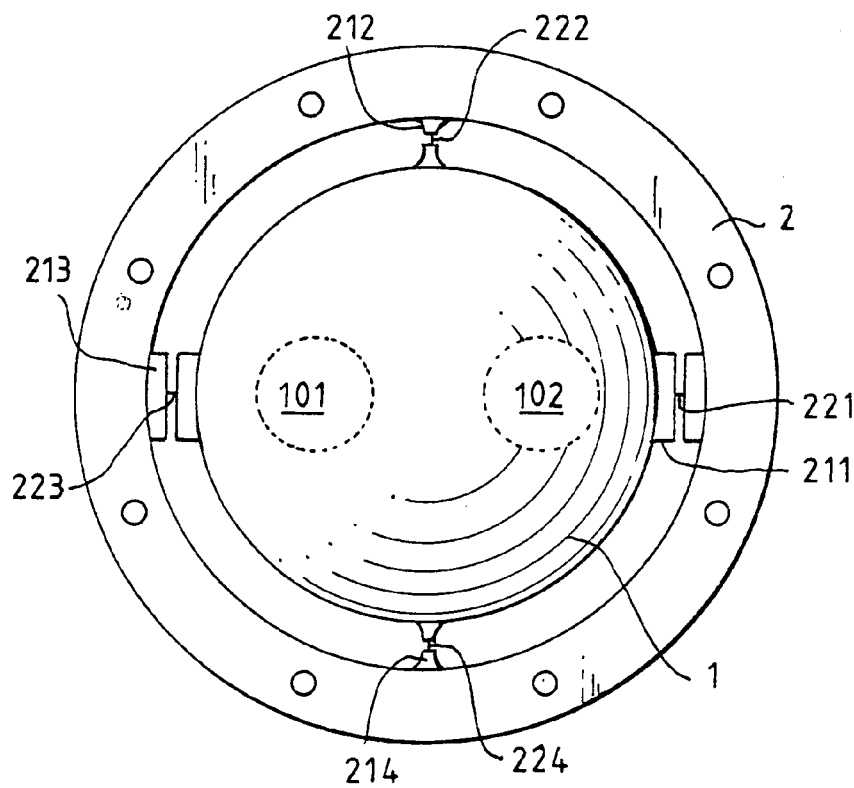
FIG. 2 shows schematically a lens with dipole-like illumination and connections to the mounting, of different cross sections.

An alternative, which however is also suitable for combination with the above described embodiment, is shown in FIG. 2. Here the lens 1 and mount 2 are connected by means of webs 211–214 (for clarity, only four are shown; in practice there are more) with different cross sections and thus different thermal conduction. Different mechanical properties are prevented by means of each web 211–214 having similar spring joints 221–224. The thermal conduction over the adjacently situated narrow gaps (only minimal mobility of the joints is required) takes place sufficiently effectively by means of the filling gas (helium) or by a flexible metal cable (stranded conductor) (see FIG. 6*b*).

The exact combination is established here also with the support of simulation calculations. A combination with the use of different materials as shown in FIG. 1 opens up wider possibilities of matching.

Additionally, a "dipole" illumination of the lens with two eccentric light spots 101, 102 is shown in this FIG. 2, as occurs in the region of the diaphragm plane and equivalent planes of projection exposure systems with symmetrical oblique illumination. Astigmatic errors due to light absorption also arise therewith, and can be reduced by passive compensating cooling.

Figure 3A:
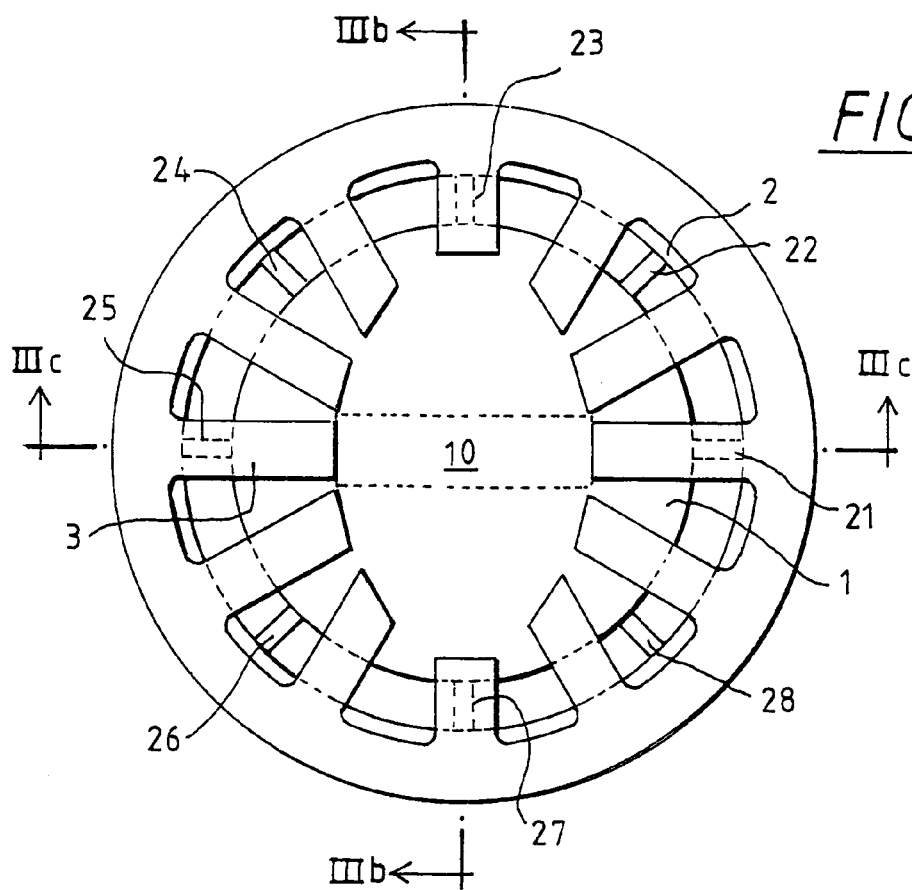
FIG. 3a shows schematically a lens with a slit-shaped illumination in a symmetrical mounting with a cooling body of non-rotationally-symmetrical shape.
Figure 3B:
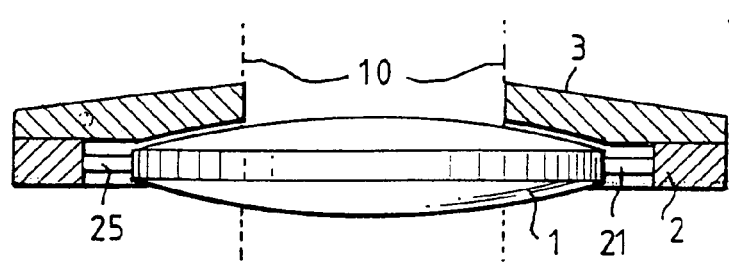
Figure 3C:
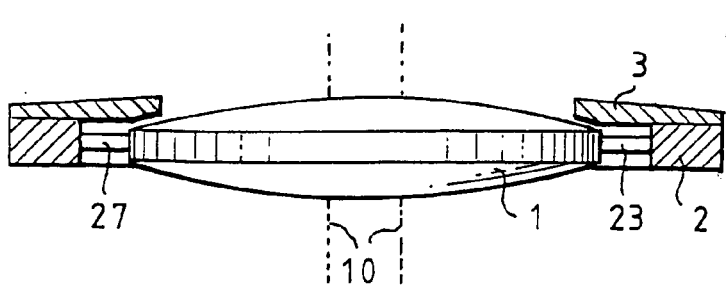

FIGS. 3*a*–3*c* show a variant of the invention with an additional thermally conducting element 3, which is provided only for the equalizing cooling.

The lens 1 and mount 2 are in this case connected with uniform webs or with selectively cooling webs according to FIG. 1 or 2. Any other mounting technique is likewise usable.

The thermally conducting element 3 is connected fast to the mount 2 with good thermal conduction, and covers portions of the lens 1 through which no light passes and which are thus outside the illuminated surface 10, also shown here as a slit.

This covering is preferably free from contact, at a spacing of about 0.1 mm, so that a good thermal transfer is assured by means of the filling gas, but no stresses can be transmitted into the lens 1. Better thermal conduction of course results when the gap between the lens 1 and the thermally conducting element 3 is filled with adhesive, a gel, liquid crystals, or the like material which transmits as little stress as possible.

The thermal conduction and its local distribution is set by the shape of the thermally conducting part 3; FIG. 3*b* shows how the part 3 extends to the neighborhood of the illuminated region 10 in the direction A—A of the length of the slit, and FIG. 3*c* shows that the distance is kept large in the transverse direction B—B.

With the embodiment shown in FIG. 3*a* of the thermally conducting element 3, with numerous fingers or spokes, their width, shape, and distribution can be made use of for the adjustment of the thermal conduction. In an embodiment as an unbroken disk or as a perforated diaphragm, the thickness of the thermally conducting element can be locally different. It is also possible to make the individual fingers, analogously to the webs 21–28 of FIG. 1, of different thermally conducting materials. The thermally conducting element 3 can of course also be arranged on both sides of the lens 1.

Figure 4:
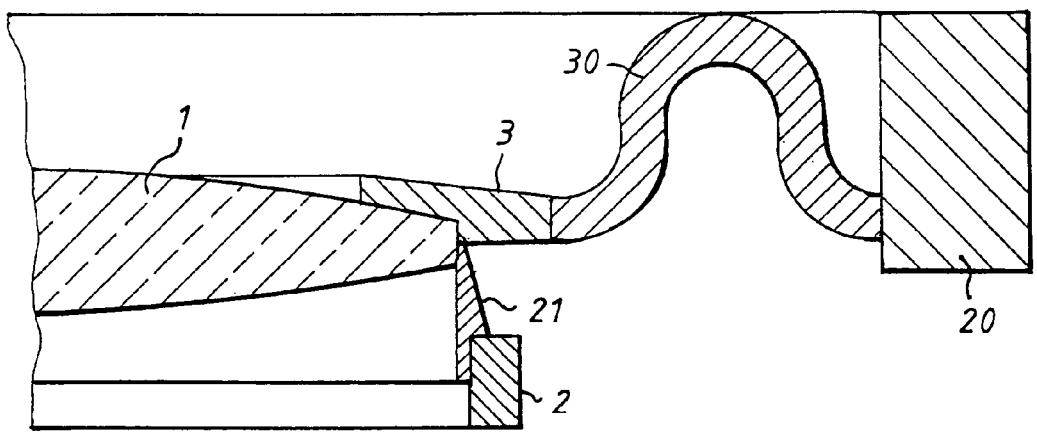
FIG. 4 shows schematically in cross section a variant with a cooling tab and heat conducting cable.

FIG. 4 shows, in an illustration corresponding to FIG. 3*b*, a manner in which the cooling element 3 can be brought into material contact or shape-fitting contact with the lens 1 without impairing the mechanical properties of the mount 2 and the connecting portions 21. For this purpose, the cooling element 3 is provided with a flexible, heat-conducting cable 30—e.g., a stranded copper wire—and is connected to a heat sink 20.

Figure 5A:
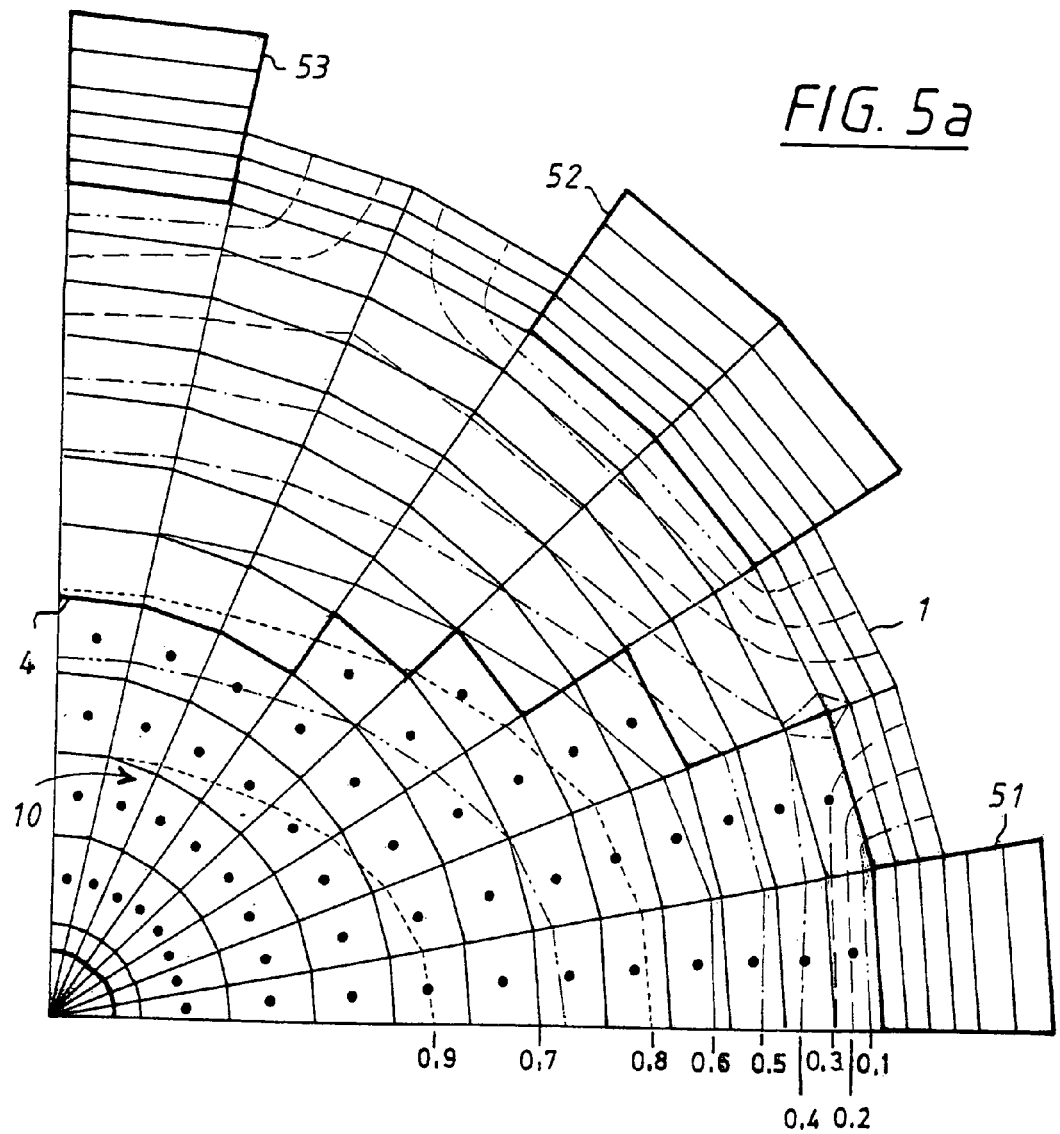
FIG. 5a shows a FEM model with symmetrically arranged like cooling bodies.
Figure 5B:
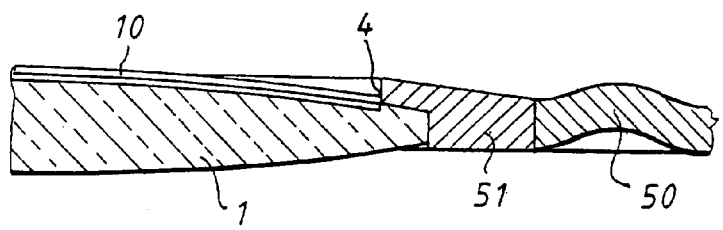
FIG. 5b shows schematically in cross section another variant with a cooling tab and heat conducting cable.

FIG. 5*a* shows in plain view the finite element model of a quadrant of a lens 1 of quartz glass (middle thickness 14.4 mm, upper radius of curvature 1600 mm, lower radius of curvature 220 mm, biconvex diameter 160 mm). Eight solid tabs (51, 52, 53) of aluminum are uniformly distributed, arranged on the lens 1 in the manner which will be apparent from the cross section, FIG. 5*b*. They are 30 mm wide, 2 mm thick above the lens and covering it for 6 mm radially, outside which they are a further 8 mm long radially, with a thickness of 4 mm. At the outer edge, they are kept to the base temperature by flexible, thermally conductive stranded wires 50, for example.

The displayed surface of the lens 1 is exposed to an introduction of 1 W/cm$^2$ of heat by light absorption in the region 4, which approximates to about a right angle in the selected element division. The temperature increase in the middle point then reaches 7.6 milli-degrees. The isotherms 0.1–0.9 are shown drawn in and indicate the course of the lines with the corresponding fraction of this temperature increase. With a higher introduction of heat, the temperature increase is linearly scaled over a wide range.

It is quite evident that in this embodiment with a symmetrical cooling arrangement, to be counted as prior art, the temperature distribution which is obtained is distributed with marked asymmetry over the whole lens.

Figure 6:
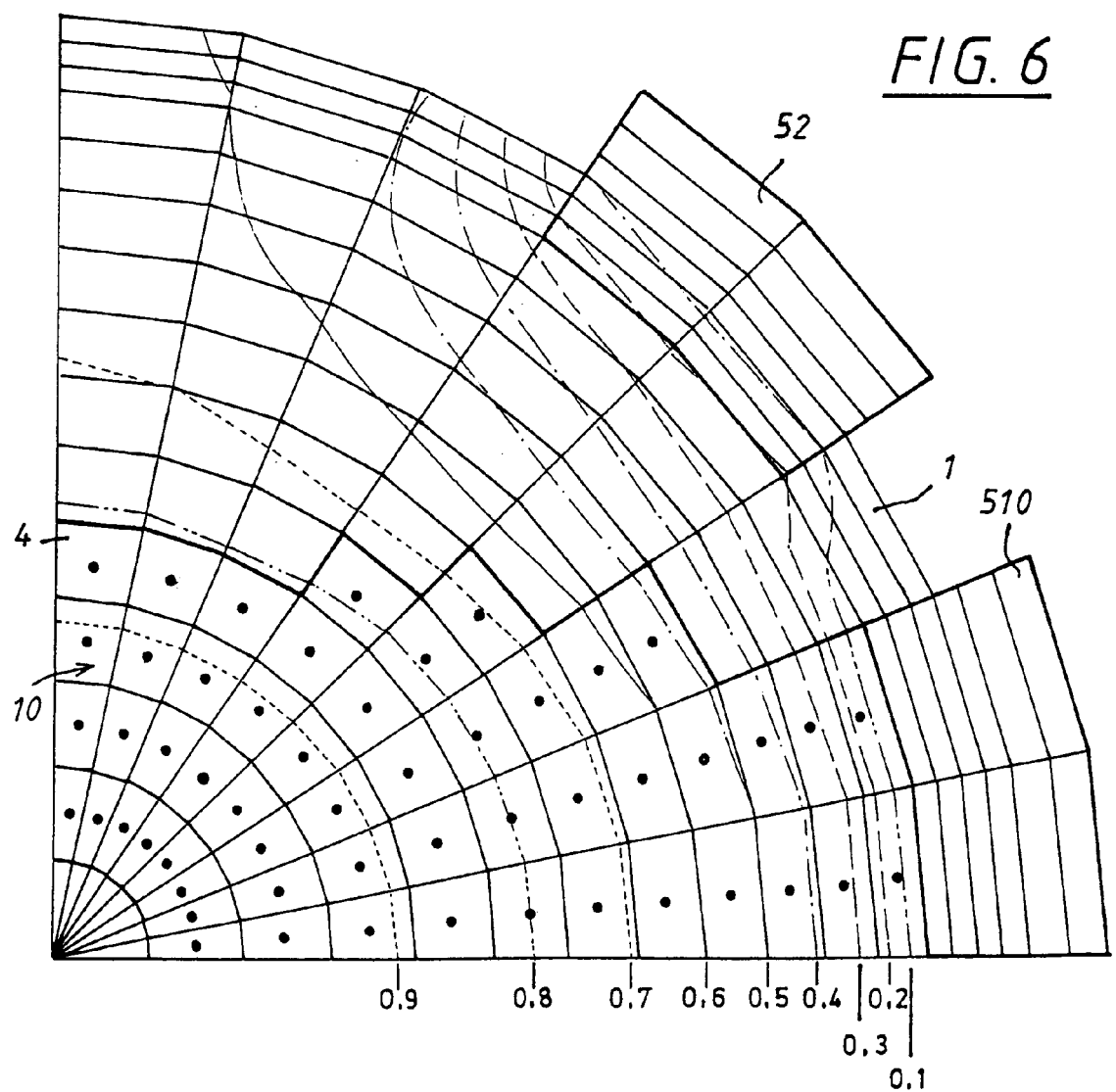
FIG. 6 shows a FEM model similar to FIG. 5a, but with the cooling body varied in position, size and material.

In the embodiment according to the invention, which is shown in FIG. 6, the cooling tabs situated on the Y-axis are omitted. The cooling tabs 510 situated on the X-axis are doubled in width and in addition are made of silver, which conducts heat better. The tabs 52 between remain unaltered, as likewise the heat supply in the region 4.

The temperature increase at the middle point now becomes 9.2 milli-degrees. The isotherms now show good rotational symmetry up to about 0.7 times the maximum temperature increase and to half the lens diameter.

The mechanical mounting of the lens 1 can either take place by means of the cooling tabs 510, 52, or an optional mounting technique is provided which preferably has comparatively small thermal conduction.

Figure 7:
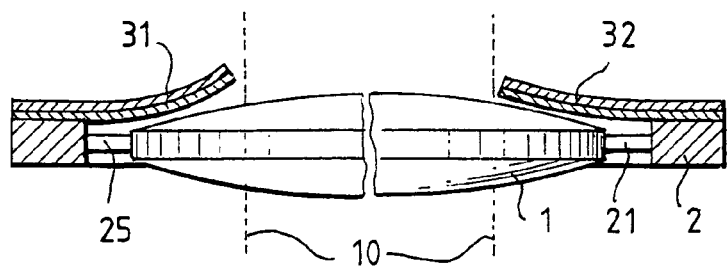
FIG. 7 shows a variant with a cooling body with temperature-induced variation of the cooling effect.

FIG. 7 shows a variant, similar to FIGS. 3a–c, in which the fingers 31, 32 of the thermally conducting element are constituted of bimetal—two layers of material of different thermal expansion. To the left in the Figure, the bimetal strip 31 is bent away from the lens 1 at the low temperature $t_1$, and can take up only little heat. To the right in the Figure, the bimetal strip 32 is straight at the higher temperature $T_2$ and is situated at a small spacing from the lens 1, so that it can carry away much heat.

The invention can of course also be applied to prismatic parts, gratings, or mirrors, and likewise to all optical components subject to uneven heat loading, in addition to the lenses as shown in the foregoing embodiments.

Figure 8:
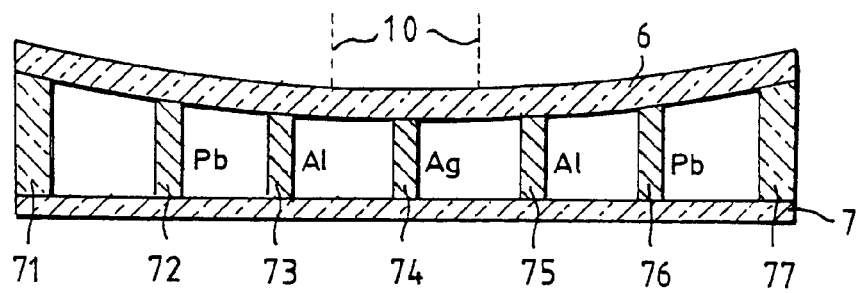
FIG. 8 shows, in schematic section, a mirror with different cooling effected by webs of different materials.

FIG. 8 shows an embodiment specially adapted to a mirror 6. The mirror 6 is supported on a mounting 7 by means of supports 71–77, which are individual webs or support rings, distributed on its back side.

The cooling action is adjusted according to requirements, to match the illuminated surface 10, by the distribution of the supports 71–77 on the back side of the mirror 6, by their shape, and also by means of the specific thermal conductivity of their material (e.g., silver at the middle 74, lead 72, 76 at the edges 72, 76, and otherwise (73, 75) aluminum, and the outer edge 71, 77 of glass ceramics).

The different thermal expansion of the materials for the supports 71–77 can be used if necessary in order to compensate for deformations of the mirror 6 due to heating, or else to cause them in a targeted manner. In the latter case, disturbances of other optical elements which cooperate in a system with the mirror 6 can be compensated.

Figure 9:
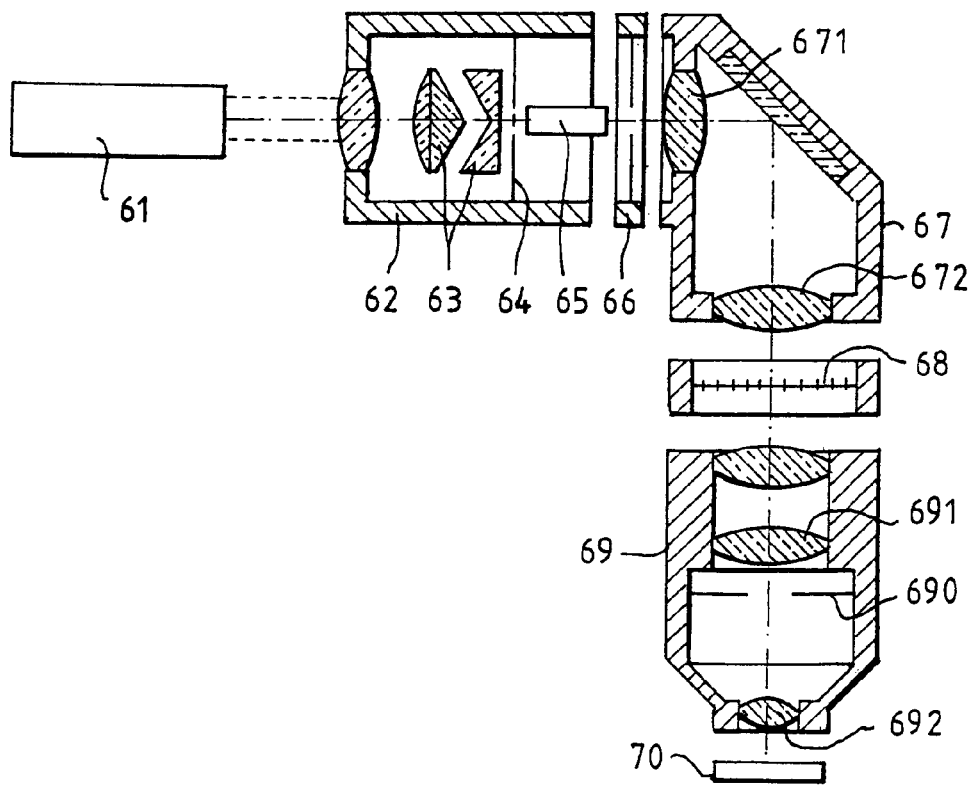
FIG. 9 shows schematically a general view of a projection exposure system.

FIG. 9 shows, in a schematic overview, the complete optical system of a projection exposure system for microlithography. A DUV excimer laser serves as the light source 61. A beam-forming optics 62 with zoom axicon objective 63 an optional diaphragm 64 (e.g. variable, conventional, ring aperture, dipole aperture, quadrupole aperture) and a homogenizing quartz rod 65 illuminates the REMA diaphragm 66, which is imaged by the following REMA objective 67 as a sharp-edged homogeneous light spot, in particular as a narrow scanning slit, on the mask 68.

The following reducing projection objective 69 images the mask 68 onto the wafer 70. The lenses 671 and 672 of the REMA objective 67 and 692 of the projection objective 69 are situated in near field planes and therefore are now preferred optical elements on which the cooling according to the invention is used. This cooling reduces the imaging errors arising due to the narrow slit-shaped illuminated field in a scanner in which the mask 68 and wafer 70 are synchronously scanned.

The lens 691 is arranged nearest the aperture diaphragm 690 of the projection objective 69. It is specially strained by special kinds of illumination, for example, a dipole aperture (see FIG. 2). However, this disturbance can also be reduced by the asymmetric cooling according to the invention.

It is clear that the description of the Figures only describes examples for the invention. In particular, multifarious combinations of the described features are possible according to the invention, and the cooling can be adjustably embodied, in order to adjust, to adapt to changes, and so on.

We claim:

1. A system, comprising:
   a light source;
   an optical element; and
   a heat conducting device comprising webs of different cross section, or fingers of different width, different shape, different thickness, or different materials,
   wherein during operation of the system the optical element is heated by radiation from the light source in a non-rotationally symmetric fashion and the optical element is cooled by the heat conducting device such that an at least partial homogenization of the temperature distribution in the optical element is effected,
   wherein the system is a microlithography projection exposure system.

2. The system according to claim 1, in which said optical element comprises a transmitting element.

3. The system according to claim 2, in which said transmitting element comprises a lens.

4. The system according to claim 1, in which said optical element comprises a mirror.

5. The system according to claim 1, wherein the system has a slit-shaped image field.

6. The system according to claim 1, in which said optical element is arranged near a field plane.

7. The system according to claim 1, further comprising a reticle, wherein during operation of the system the reticle is illuminated with illumination which lacks rotational symmetry.

8. The system according to claim 7, in which said reticle illumination is off-axis, dipole or quadrupole illumination.

9. The system according to claim 1, in which said optical element is arranged near a pupil plane.

10. The system according to claim 1, in which said heat conducting device comprises a connecting structure that comprises portions of different materials.

11. The system according to claim 1, in which said heat conducting device comprises a connecting structure that comprises adjustable portions.

12. The system according to claim 1, in which said heat conducting device comprises a thermally conducting element.

13. The projection exposure system according to claim 12, in which said thermally conducting element comprises adjustable portions.

14. The system according to claim 1, in which the optical element is fastened in a mount, the heat conducting device is provided between the optical element and the mount as a connecting structure which exhibits a symmetry not corresponding to the shape of the optical element, and
   wherein during operation of the system radiation is applied to the optical element in such a way that heat is fed in a fashion exhibiting no symmetry corresponding to the shape of the optical element, and the optical element is cooled by the heat conducting device in such a way that the at least partial homogenization of the temperature distribution in the optical element is effected.

15. The system according to claim 14, further characterized in that the connecting structure is constructed from parts formed from different materials.

16. The system according to claim 14, further characterized in that the connecting structure has adjustable parts.

17. The system according to claim 1, in which the optical element is fastened in a mount, the heat conducting device is a unipartite or multipartite heat conducting element and is connected to the optical element and the mount, and
 wherein during operation of the system radiation is applied to the optical element in such a way that heat is fed in a fashion exhibiting no symmetry corresponding to the shape of the optical element and the optical element is cooled by the heat conducting device such that a form of heat transport results which effects an at least partial compensation of the asymmetry of the temperature distribution in the optical element.

18. The system according to claim 17, further characterized in that the heat conducting element comprises parts made from different materials.

19. The projection exposure system according to claim 17, further characterized in that the heat conducting element is adjustable.

20. The system according to claim 1, further characterized in that at least one part of the heat conducting device is in thermal contact with the optical element, covers a part of the cross section of the optical element not touched by the radiation during operation of the system, and reduces temperature gradients in the optical element during operation of the system.

21. The projection exposure system according to claim 20, further characterized in that the part or parts in thermal contact comprise a number of different materials.

22. The system according to claim 20, further characterized in that the part or parts in thermal contact are at least partially adjustable.

* * * * *